(12) United States Patent
Vieilly et al.

(10) Patent No.: US 8,452,435 B1
(45) Date of Patent: May 28, 2013

(54) COMPUTER SYSTEM AND METHOD FOR PROVIDING EXPLODED VIEWS OF AN ASSEMBLY

(75) Inventors: Lionel Vieilly, Villefontaine (FR); Christophe Dumoulin, Meyzieu (FR); Cedric Patriarca, Saint Fons (FR); Eric Lievre, Bron (FR); Carole Bonche, Meyzieu (FR)

(73) Assignee: Adobe Systems Incorporated, San Jose, CA (US)

( * ) Notice: Subject to any disclaimer, the term of this patent is extended or adjusted under 35 U.S.C. 154(b) by 978 days.

(21) Appl. No.: 11/751,243

(22) Filed: May 21, 2007

Related U.S. Application Data

(60) Provisional application No. 60/808,424, filed on May 25, 2006.

(51) Int. Cl.
| | | |
|---|---|---|
| *G06F 19/00* | (2006.01) | |
| *G06F 17/00* | (2006.01) | |
| *G06G 5/00* | (2006.01) | |
| *G06T 1/00* | (2006.01) | |
| *G06T 15/00* | (2006.01) | |

(52) U.S. Cl.
USPC .............. 700/98; 700/97; 345/619; 345/418; 345/419; 345/650

(58) Field of Classification Search
USPC .............. 700/97, 98; 345/619, 418, 419, 650
See application file for complete search history.

(56) References Cited

U.S. PATENT DOCUMENTS

| | | | |
|---|---|---|---|
| 6,295,063 B1 * | 9/2001 | Minami et al. | 345/419 |
| 6,720,949 B1 | 4/2004 | Pryor et al. | |
| 6,725,184 B1 | 4/2004 | Gadh et al. | |
| 7,042,468 B2 | 5/2006 | Schwegler et al. | |
| 7,075,531 B1 * | 7/2006 | Ando et al. | 345/420 |
| 7,119,805 B2 | 10/2006 | Batori et al. | |
| 7,262,766 B2 | 8/2007 | Minami et al. | |
| 7,295,201 B2 | 11/2007 | Davis et al. | |
| 7,567,850 B2 * | 7/2009 | Yamada et al. | 700/98 |
| 7,710,420 B2 * | 5/2010 | Nonclercq et al. | 345/440 |
| 2003/0043177 A1 * | 3/2003 | Kawai | 345/700 |
| 2003/0097195 A1 * | 5/2003 | Yamrom et al. | 700/95 |
| 2003/0098862 A1 * | 5/2003 | Hunt et al. | 345/418 |
| 2005/0248560 A1 * | 11/2005 | Agrawala et al. | 345/418 |
| 2006/0053071 A1 * | 3/2006 | Yamada et al. | 705/29 |
| 2006/0066609 A1 | 3/2006 | Iodice et al. | |
| 2006/0100722 A1 | 5/2006 | Bell | |
| 2006/0129574 A1 | 6/2006 | Shin et al. | |
| 2007/0019888 A1 | 1/2007 | Larking | |
| 2007/0070073 A1 * | 3/2007 | Davis et al. | 345/474 |
| 2007/0165049 A1 * | 7/2007 | Murawski et al. | 345/619 |

OTHER PUBLICATIONS

Mohammad, Riaz and Kroll, Ehud. "Automatic Generation of Exploded Views by Graph Transformation", 1043-0989/93, 1993, IEEE, pp. 368-374.*

* cited by examiner

*Primary Examiner* — Sean Shechtman
*Assistant Examiner* — Jason Lin
(74) *Attorney, Agent, or Firm* — Kilpatrick Townsend & Stockton LLP

(57) ABSTRACT

In response to user selection of automatic generation of an exploded view of a data element at a level in a hierarchical representation of an assembly, an exploded view of at least part of the assembly at the selected level can be generated automatically and the exploded view presented to the user.

24 Claims, 20 Drawing Sheets

COMPUTER SYSTEM AND METHOD FOR PROVIDING EXPLODED VIEWS OF AN ASSEMBLY

CROSS REFERENCE TO RELATED APPLICATION

This application claims the benefit of U.S. Application No. 60/808,424 filed on May 25, 2006, the contents of which are hereby incorporated by reference.

BACKGROUND

This invention relates to a computer implemented method and a computer system for processing and presenting data to provide exploded views of an assembly represented, for example, as computer aided design (CAD) data.

CAD data is used in many different applications. CAD data can be used to model very complex structures that include many sub-assemblies and components. For example, CAD data can be used to model ships, aeroplanes, cars, motorcycles, tools, and indeed all forms of devices. There are also many different packages available for generating CAD data and the resulting data files can have very complex data structures.

Viewers can be provided for viewing data from different formats. Such viewers can also be used for manipulating the data from those different formats.

In order to facilitate the interaction with CAD data, to facilitate the manipulation of that data by a user, and the generation of images in respect thereof, it is desirable to provide the user with the tools which are able to understand and manipulate the data. The invention seeks to facilitate the display and/or manipulation of data defining assemblies, to enable the generation of exploded views in an efficient manner.

SUMMARY OF THE INVENTION

An embodiment of the invention can provide a method of processing a data structure that includes a hierarchy of data elements. An auto-explode process can provide an exploded view of an assembly, or part of an assembly.

In one embodiment, the data structure includes a hierarchy of data elements representing a plurality of levels of parts of an assembly. In response to user selection of automatic generation of an exploded view of a data element at a level in the hierarchy, an exploded view of at least part of the assembly at the selected level can be generated automatically and the exploded view presented to the user.

In one embodiment, a computer system comprises at least one processor, at least one of memory and storage for a data structure that includes a hierarchy of data elements representing parts of an assembly, and a display. The computer system can be operable to hold a data structure that includes a hierarchy of data elements representing a plurality of levels of parts of an assembly, to receive user selection of automatic generation of an exploded view of a data element at a level in the hierarchy, to generate an exploded view of at least part of the assembly at the selected level, and to present the exploded view to the user.

One embodiment of the invention can be in the form of a computer program product operable to control the processor(s) of such a computer system.

Although specific combinations of features are identified in the independent and dependent claims, it will be appreciated that embodiments of the invention may include combinations of the features of the independent and dependent claims other than those specifically identified by the dependencies of the accompanying claims.

BRIEF DESCRIPTION OF THE FIGURES

Example embodiments of the invention will now be described by way of example only with reference to the accompanying drawings.

Figure 1:
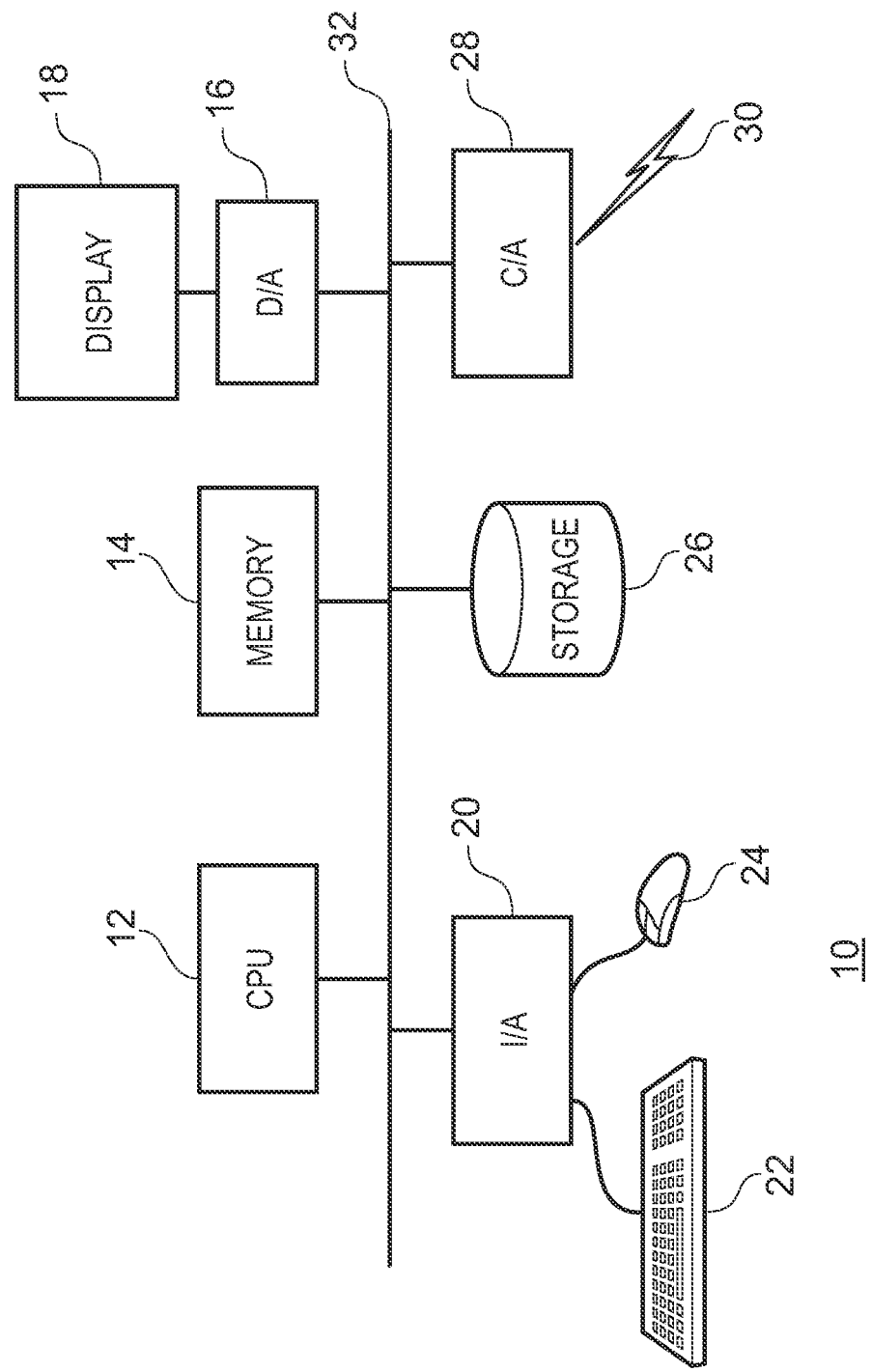
FIG. 1 is a schematic representation of an example computer system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

An example embodiment of the invention will be described in the following.

FIG. 1 is a schematic diagram illustrating an example of a computer system 10 for implementing an example embodiment of the present invention. Various components are interconnected by a bus system 32. One or more processors 12 can be provided. Random access memory 14 can also be provided as a working memory. A display adaptor 16 can enable the connection of a display 18. An input/output adaptor 20 can enable the connection of one or more user input devices, for example a keyboard 22 and a mouse 24 and/or one or more output devices, such as, for example, a printer (not shown). Storage 26 can provide for persistent storage of data. In the present example, a data structure that includes a hierarchy of data elements can be stored in the storage 26. A communications adaptor 28 can provide connection to a network via a link 30. It will be appreciated that FIG. 1 is a schematic representation, only, of a computer system, and that the computer system can take many different forms.

Figure 2:
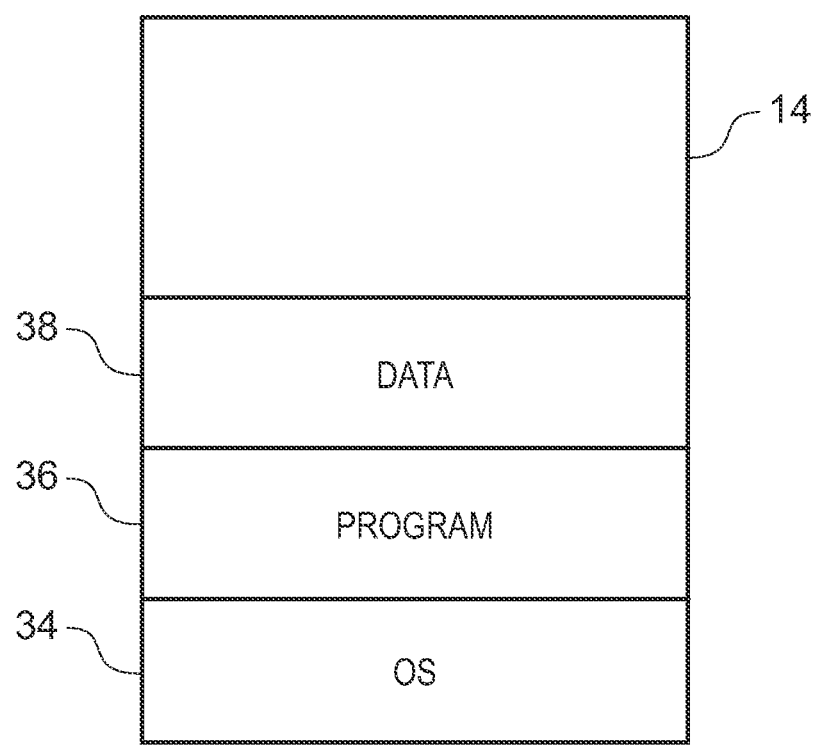
FIG. 2 is a schematic representation of example contents of a memory of the computer system of FIG. 1.

FIG. 2 provides a schematic overview of information held in a memory 14 during operation of the computer system. The data in the memory 14 can be loaded, for example, from read-only memory (not shown) and/or from the storage 26. The information in the memory 14 can include components of an operating system 34, components of a program 36 operating on the operating system, and data 38 for use by the operating system 34 and the program 36. In the operation of an example embodiment of the invention, data elements of the data structure referred to with reference to FIG. 1 can be loaded from the storage 26 into the memory 14. In order to provide for efficient use of the memory 14, it is desirable that only those data elements that are currently needed are loaded into the memory 14.

Figure 3:
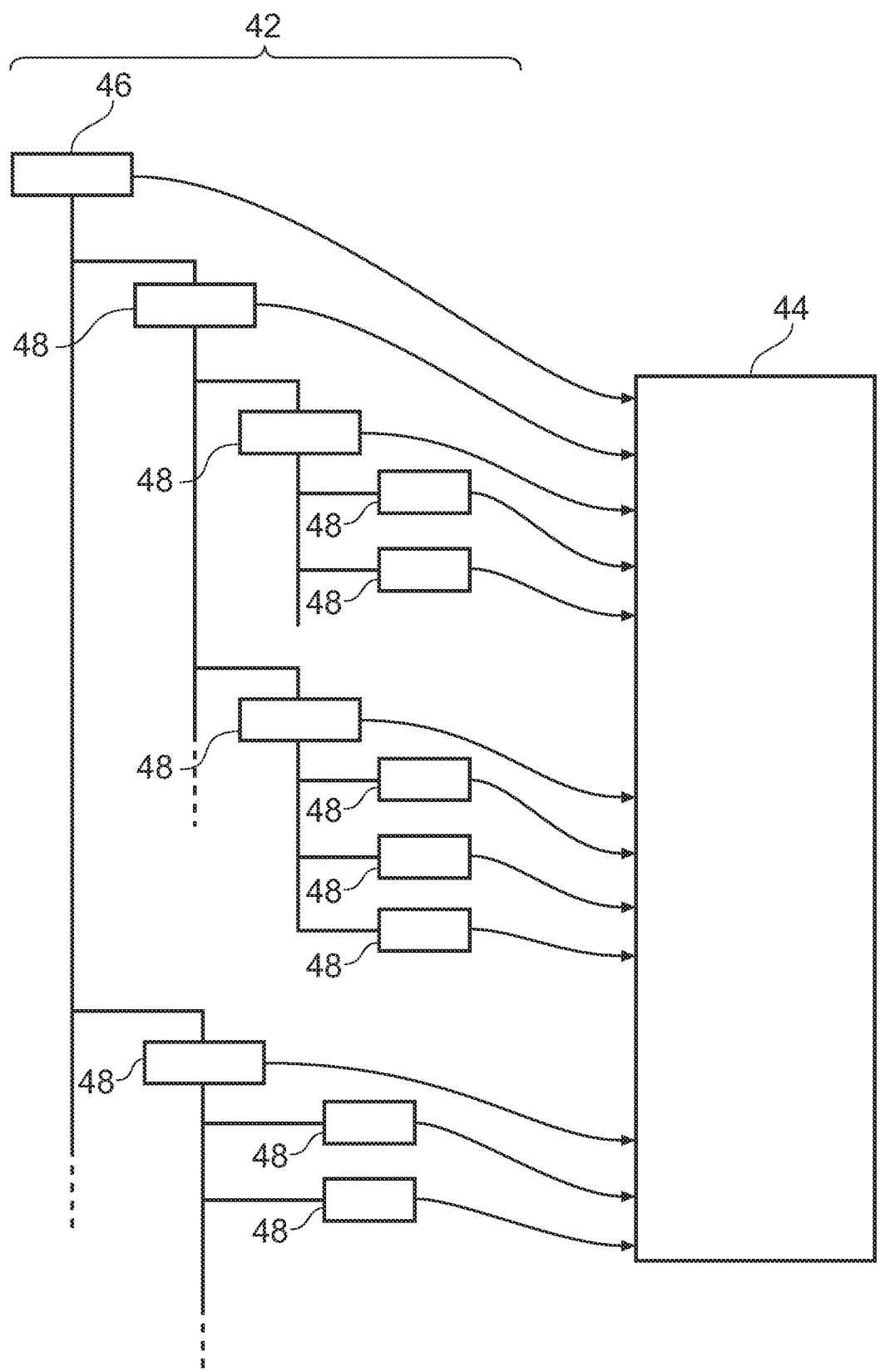
FIG. 3 is an example data structure for representing CAD data.

FIG. 3 is a schematic representation of an example of such a data structure 42. As illustrated in FIG. 3, a hierarchical structure 42 is provided to represent one or more objects. The object(s) can be a physical device, component, assembly, or the like. Within the hierarchical structure 42, a plurality of data elements 46 and 48 are shown. Data element 46 is a root element forming a root node for representing a complete object. The data elements 48 can represent sub-assemblies, components, parts, etc (hereinafter parts) of the object.

It is to be understood in this document that references to a "part" in the context of one or more data elements does not mean that an entity concerned is single unitary part, but rather that can be any one of a sub-assembly, a component, etc. Accordingly, where reference is made to a "part" herein, it is to be understood that the part can be a single component or a sub-assembly or complete assembly of components.

The data elements 48 are linked either directly or indirectly to the root node. Through the use of the hierarchical structure 42 illustrated in FIG. 3, various levels of parts can be linked together. For example, elements can be related to components, components can be related to sub-assemblies and the sub-assemblies can be related to other sub-assemblies and/or to the whole object in a manner that permits individual manipulation of the elements, components, sub-assemblies and indeed the whole object.

In an example embodiment of the invention described herein, the hierarchical structure 42 is generated with respect to base data 44. The base data 44 can be a binary file representative of the object which has been generated, for example, by a computer aided design (CAD) package independently of example embodiment described herein. The example embodiment is able to analyze the base data 44 and to generate, from that base data 44, the hierarchical structure 42.

Figure 4:
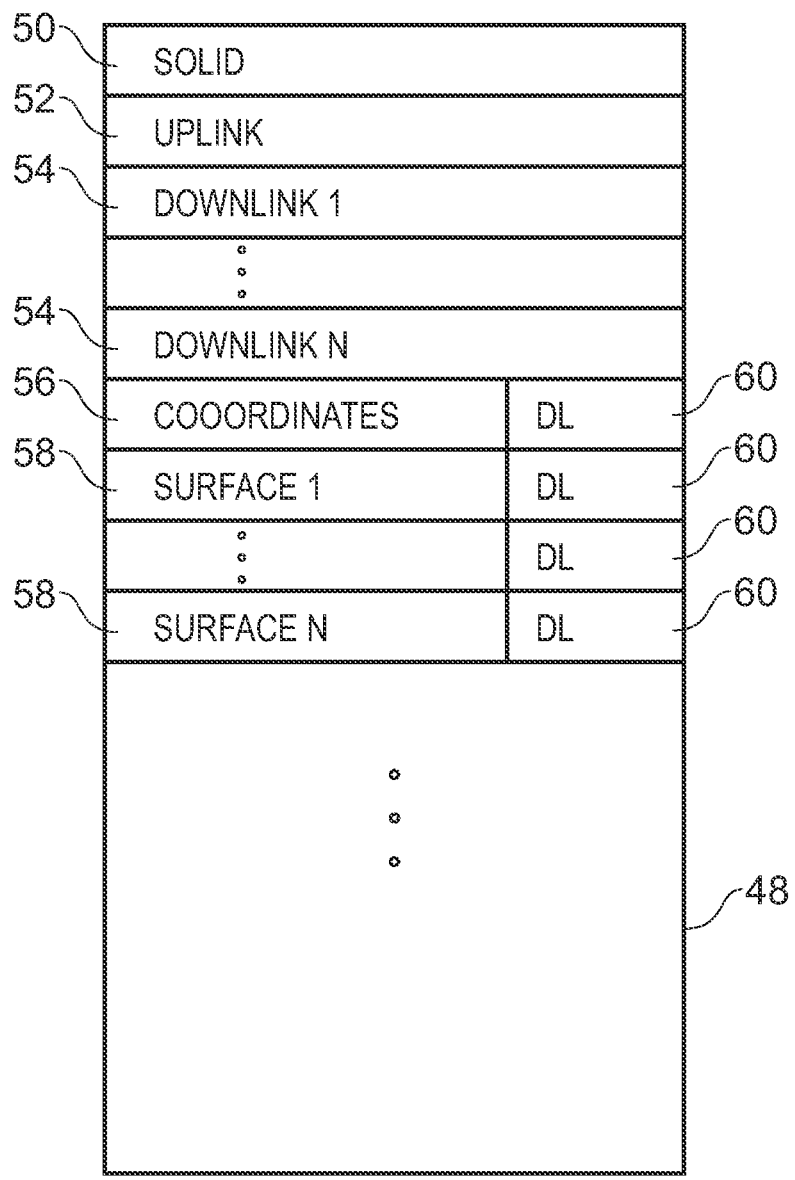
FIG. 4 is an example of a data element of the data structure of FIG. 3.

FIG. 4 is a schematic representation of an example of a data element 48. The data element 48 can include an identifier for the data element 48. The identifier 50 can be a simple identifier, or could be an identifier which has a hierarchical representation identifying the relationship of the particular data element 48 to other data elements in the hierarchy 42.

An uplink 52 can provide a link to a parent data element 48 (i.e., the next higher data element in the hierarchy), and one or more down links 54 can provide a link to one or more daughter data elements 48 (i.e., lower elements in the hierarchy). In this manner, the hierarchical structure represented in FIG. 3 can be generated.

Coordinates 56 are provided identifying the coordinate axes (element coordinate axes) for the part represented by the data element 48 and the location of that part. The element coordinate axes are identified such that the relationship between the element coordinate axes of the part to which the data element 48 relates and global coordinate axes (i.e. for the whole object) can be defined, and also that the absolute position of the part (the original of the element coordinate axes) with respect to the global coordinates axes can be defined. In one example, this is done by defining a direct relationship to the global coordinate axes. Alternatively, in another example, this can be done by defining a relationship between the element coordinate axes for a part and the origin thereof with respect to element coordinate axes of the part represented by the parent data element next higher data structure hierarchy.

As illustrated in FIG. 4, the characteristics of the component represented by the data element 48 are identified in one or more entries at 58. The data entries 58 can identify the characteristics of each face or surface of the object, the volume of the object, or in any other form. In one example, the component is defined by a linked list of faces for the object whereby each face is represented in terms of triangles (i.e., the component surface is tessellated). In other examples, other representations can be employed. Links (DL) 60 from the entries in the data element 48 can be provided to link the data entries of the data element 48 to the source data in a base data file 44.

Figure 5:
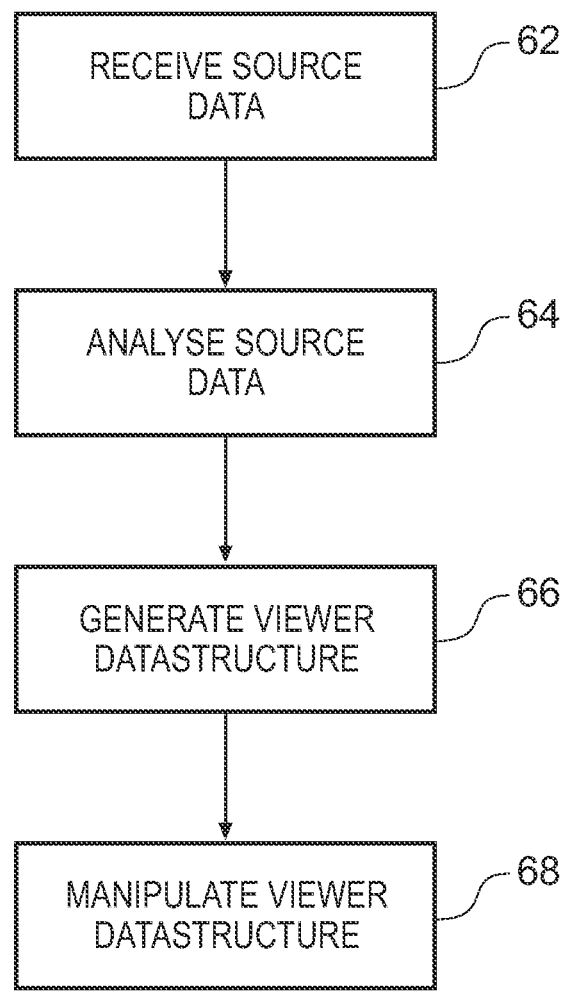
FIG. 5 is a flow diagram giving an overview of the generation and manipulation of a CAD data structure.

FIG. 5 is a flow diagram giving an overview of the generation of a data structure 42 as illustrated in FIG. 3. The present example embodiment comprising a computer application formed by a computer program that is operable in a computer system to carry other the various methods described herein.

At 62, the source data, or base data 44 is received. At 64, translation algorithms are used to identify recognizable characteristics of the source data. At 66, the data structure 42 illustrated in FIG. 3 is generated. At 68, the data structure 42 can be manipulated. These steps can be carried out by an example embodiment in the form of a computer program as described above.

In the following, examples of the manipulation of the viewer data structure, and the tasks that may be performed thereby, will be explained in more detail.

Figure 6:
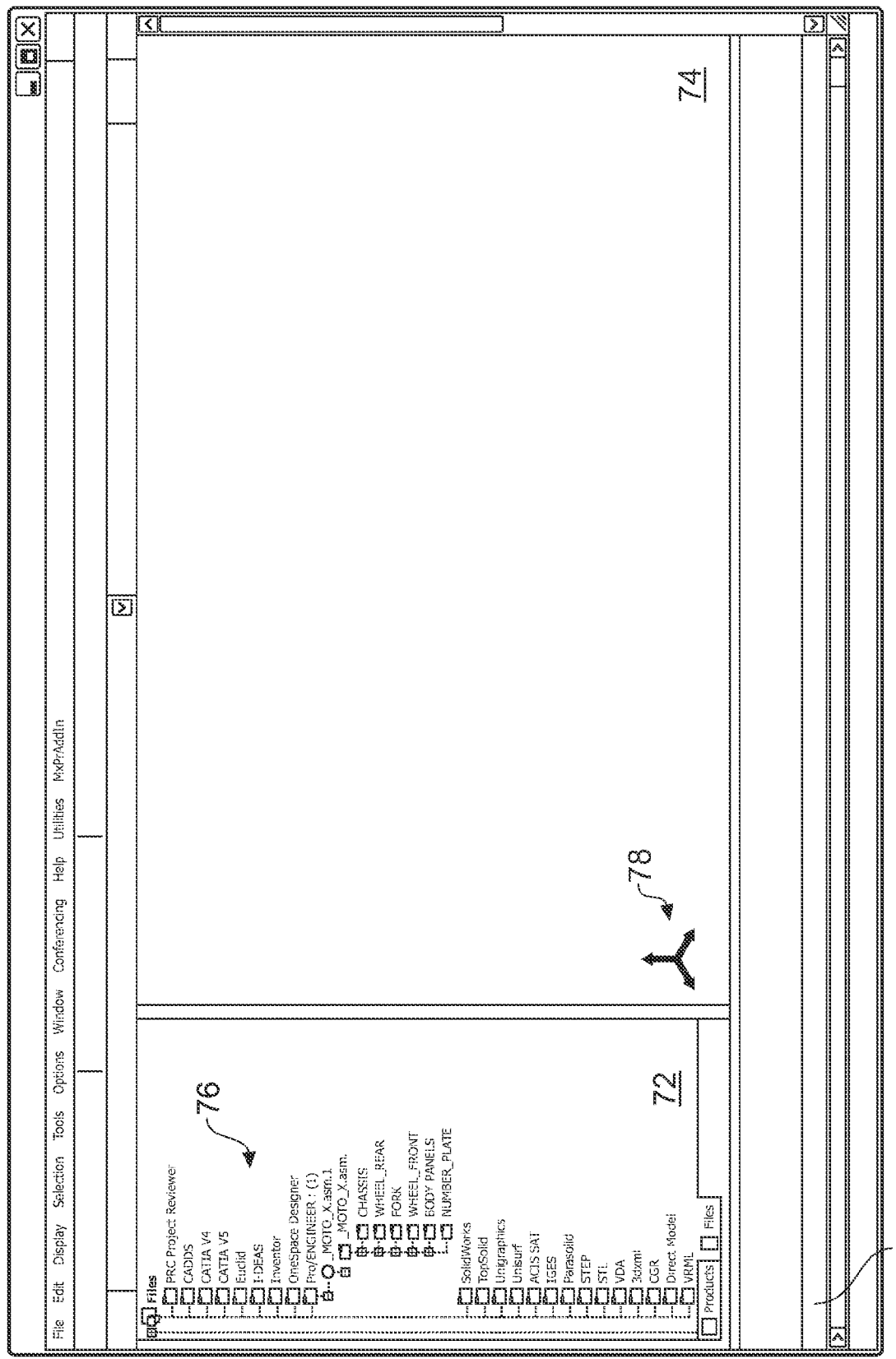
FIG. 6 is a screen shot giving an example of a window for manipulating CAD data.

FIG. 6 is a view of a screen shot showing a window 70. The window 70 includes a first pane 72 (the left hand, or data pane) in which a parts tree 76 can be displayed. The parts tree 76 can be used to select and manipulate items for display, as will be described in the following. A second pane 74 (the right hand, or display pane) provides a space for displaying representations of assemblies, as will be described in the following. The display of the assemblies is performed with respect to a so-called view coordinate system represented by the view coordinate system triedron 78. The view coordinate system is a reference coordinate system for viewing purposes according to which standard views (for example a front view, a left view, etc.) are organized.

In one example, as a default (when opening a CAD assembly for example), the view coordinate system can be the same as a base coordinate system, also termed a global coordinate system herein. During a session, a user may change the view coordinate system so that the coordinate system represented by the view coordinate system triedron may no longer represent the global coordinate system. However, for ease of explanation herein, it will be assumed that the view coordinate system is the same as the global coordinate system (i.e. it has not been modified by the user), whereby in the examples shown herein, the view coordinate system triedron 78 also represents the global coordinate system, and will be referred to hereinafter as the global coordinate system.

Figure 7:
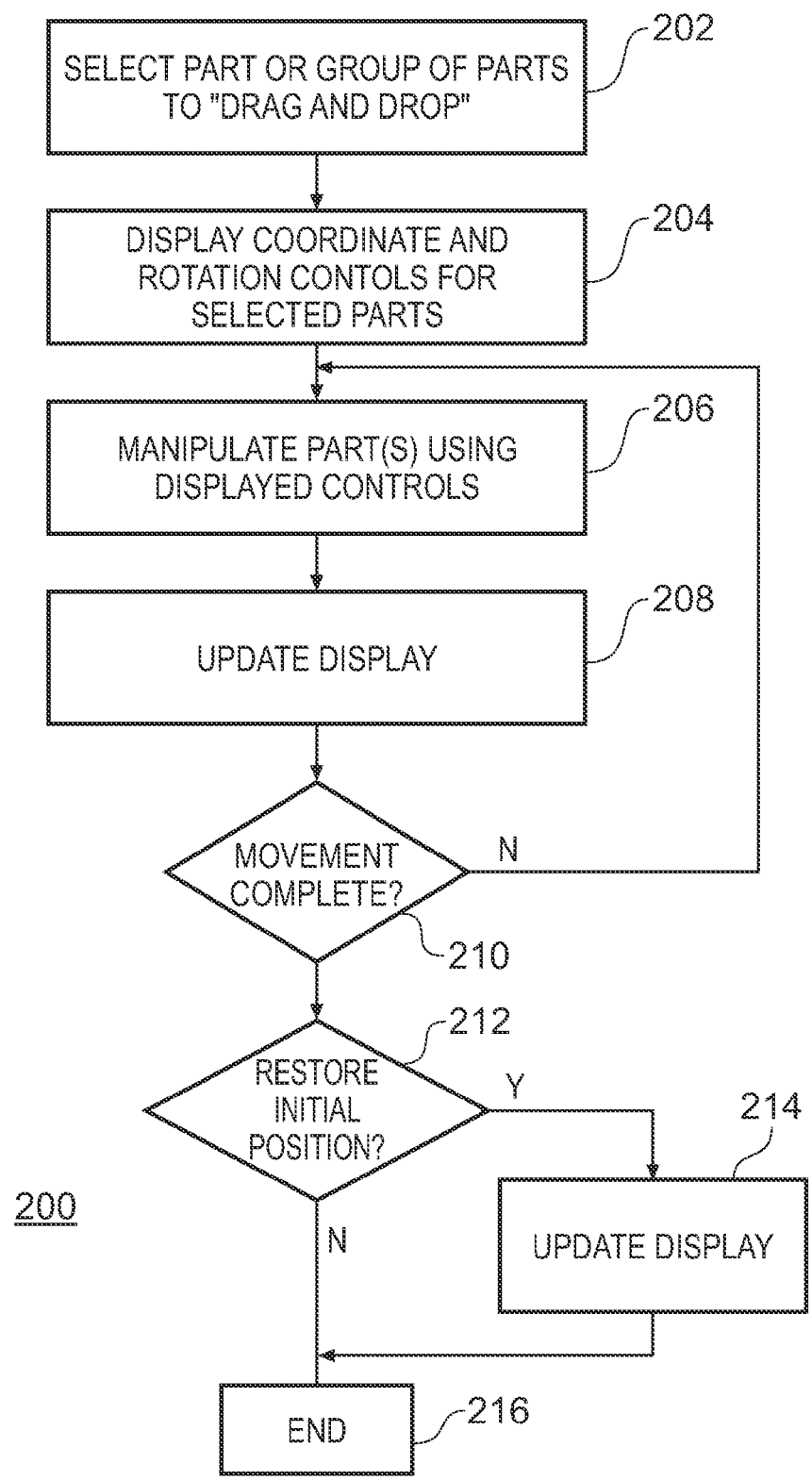
FIG. 7 is a flow diagram illustrating a drag and drop functionality.

FIG. 7 is a flow diagram illustrating one type of manipulation which enables individual parts to be manipulated as a unit. This form of manipulation will be described as a "drag and drop" manipulation.

In the process 200 described with reference to FIG. 7, in step 202 a selected part or parts is or are selected for drag and drop manipulation. As mentioned above, where reference is made to a part in the following, it is to be understood that the part can be a single component or a sub-assembly or complete assembly of components.

In step 204, in response to the selection of the parts, coordinate axes and translation and rotation controls for the selected part are displayed. As described earlier with reference to FIG. 4, in the data structure defining the assembly, a data element defining a part includes a definition of the part with respect to the coordinate axes for the part, and also the relationship between the coordinate axes for the part and global, or base, coordinate axes. Accordingly, the displayed coordinate and rotation controls for the selected parts can differ from the base coordinate axes represented at 78 in the right hand pane.

In step 206, the user is able to manipulate those parts using the displayed coordinates and rotation controls. The manipulation can take the form of the user selecting a translation or rotation control associated with a coordinate axis, for example by putting a mouse pointer over the control concerned, clicking the mouse button and then dragging the control by a desired amount.

In step 208, the system is operable to update the display as a result of the manipulation and to modify the definition of the coordinate axes for part (the element coordinate axes) in the data element for the part.

If, in step 210, the manipulation is not complete, then control passes back to step 206.

Otherwise, the user is provided with an opportunity to restore the initial position at step 212. If the user decides to restore the initial position, the data for the part is reset and the display is updated at step 214 to show the initial position for the selected part or parts. The process ends at step 216.

These operations can be performed by providing a bounding box for the part concerned, the bounding box being provided with the coordinate and rotational controls referred to in FIG. 7. This facilitates straight-forward control of the manipulation of that part in a user friendly manner, and requires many less steps to manipulate a part than would be the case if the manipulation were to be performed on the basis of the global coordinate axis 78 represented in the right hand pane 74.

FIGS. 8-13 illustrate examples of the manipulation of a part using the drag and drop functionality described with reference to FIG. 7.

Figure 8:
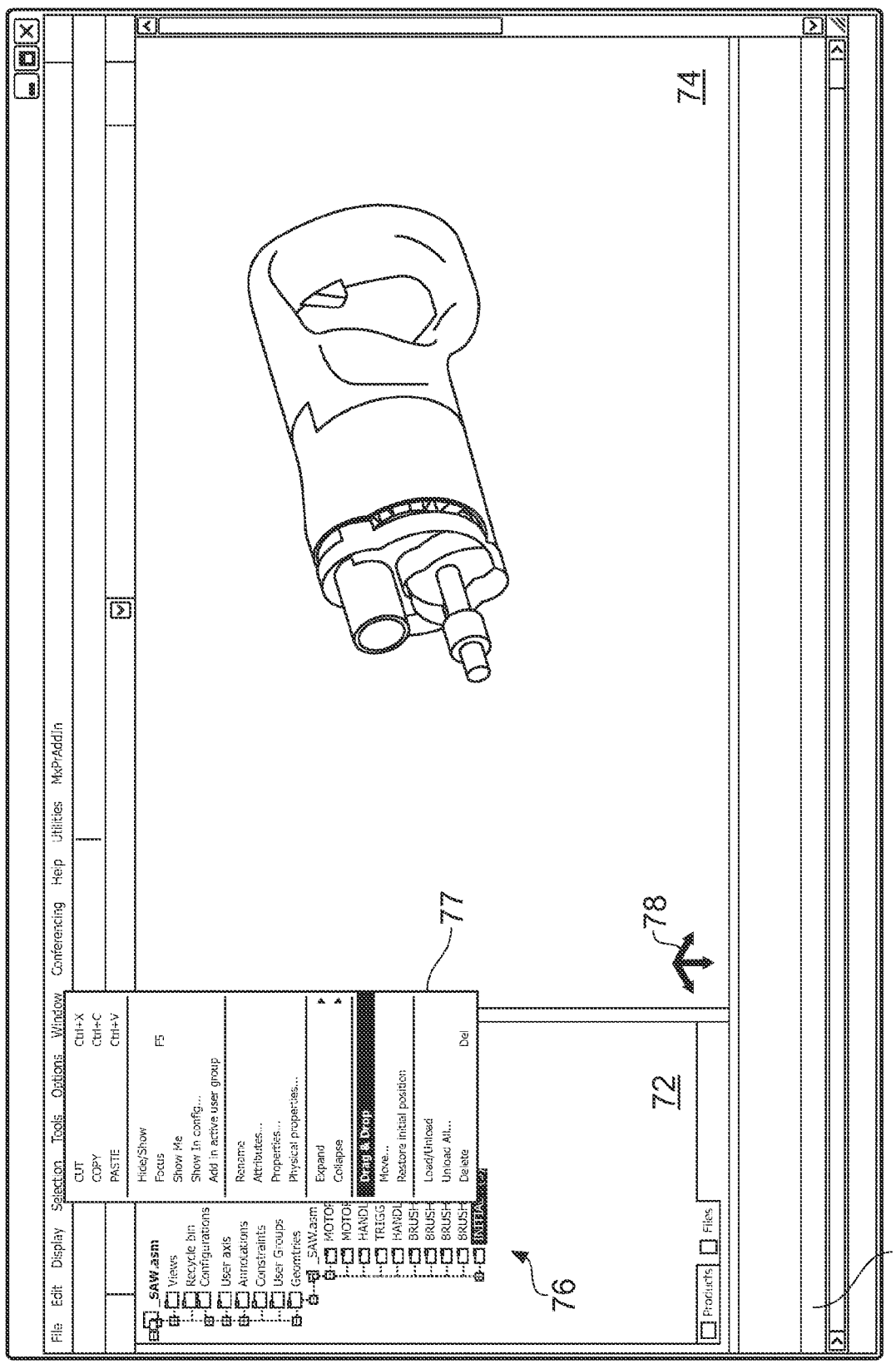
FIGS. 8-13 are screen shots for illustrating the drag and drop functionality.

FIG. 8 represents an assembly which has been loaded in a session in the right hand pane 74, the overall object being defined with respect to base coordinate axis 78. As illustrated in the left hand pane 72, the user has selected a drag and drop functionality using a drop down menu 77 and for a highlighted part (in this case the sub-assembly "initial" 76).

Although in FIG. 8, the selection of part (here a sub-assembly) using the left hand pane is shown, the part could be selected, for example, by clicking on a part or selecting all parts within an area defined on the right hand pane (for example by identifying the top left and bottom right of a rectangle defining the area).

Figure 9:
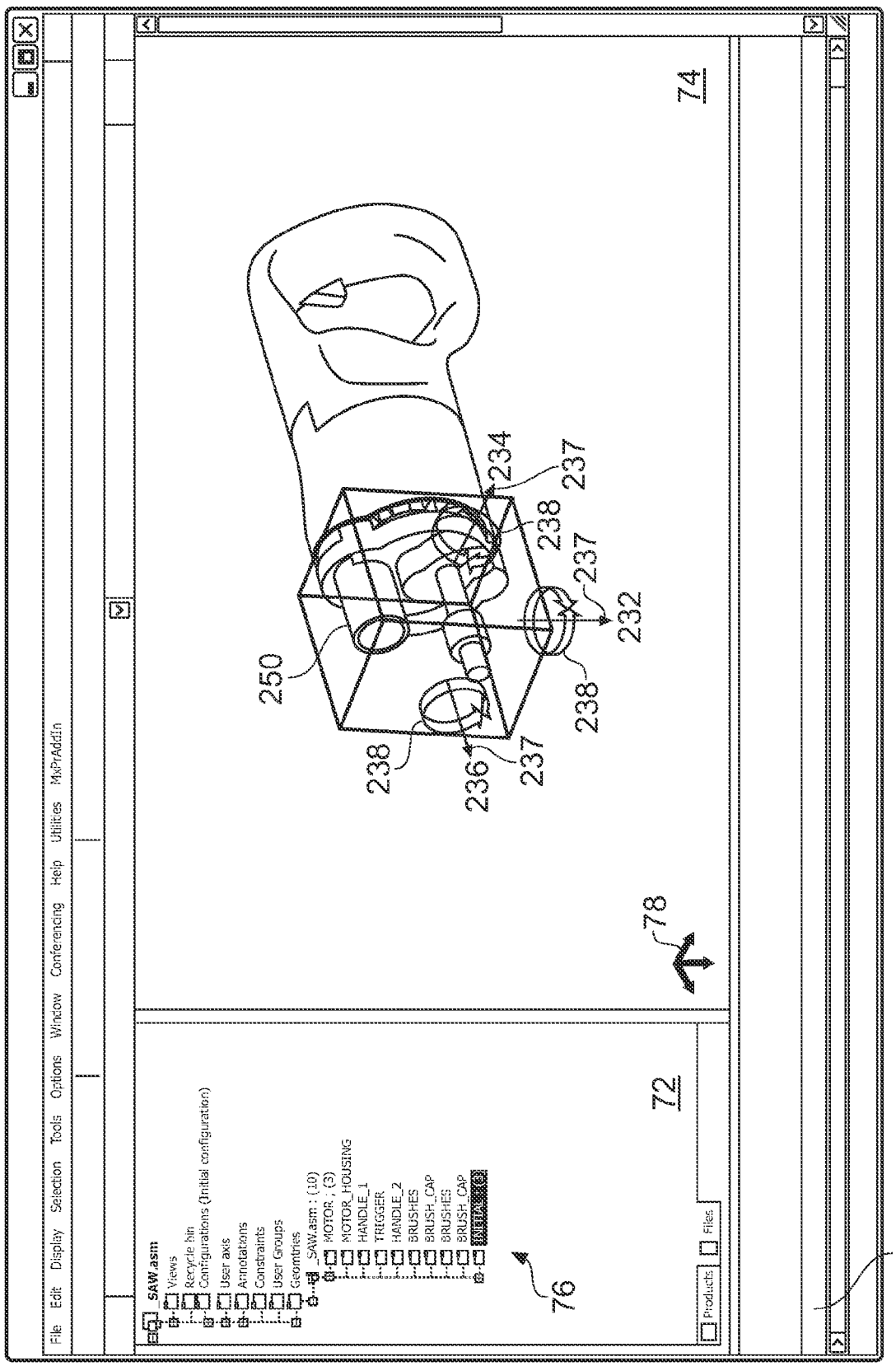

Once a part has been selected, as illustrated in FIG. 9, the system generates a bounding box 230 for the selected component, which is displayed in the right hand pane. The bounding box is provided with indicators 237 for the coordinate axis 232, 234 and 236. The indicators 237 can, for example, be in the form of arrows, which can be used as translation indicators, or translation controls, with respect to the coordinate axes 232, 234 and 236 for the selected component 250. Rotation indicators, or rotation controls, 238 can also be displayed with respect to the coordinate axes 232, 234 and 236.

As described with reference to FIG. 7, the translation and rotation controls 237 and 238 can be used to perform the manipulation. The manipulation can take the form of the user selecting a translation or rotation control associated with a coordinate axis, for example by putting a mouse pointer over the control concerned, clicking the mouse button and then dragging the control by a desired amount.

Figure 10:
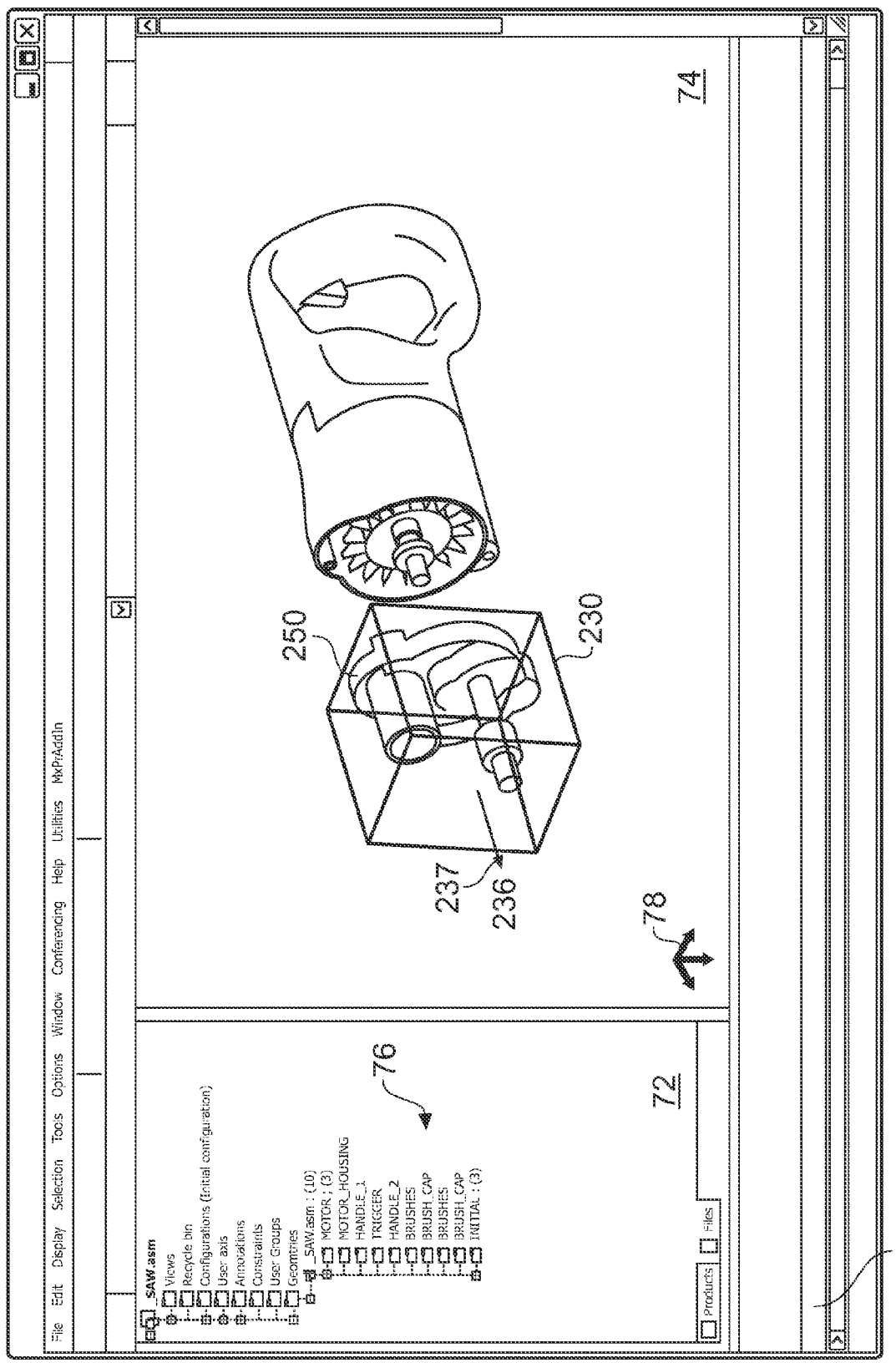

FIG. 10 illustrates an example of the result of a translation in the direction of the axis 236. For example, this can be effected by the user selecting the translation control arrow 237 for the axis 236 by placing a mouse pointer over the control 237 for the axis 236, clicking the mouse button and then dragging the control by a desired amount. It will be noted that the bounding box 230 has moved with the component assembly 250 from its original position. The amount of translation can also be indicated beside the mouse cursor (not shown), so that the user can control an accurate way the value for the translation.

Figure 11:
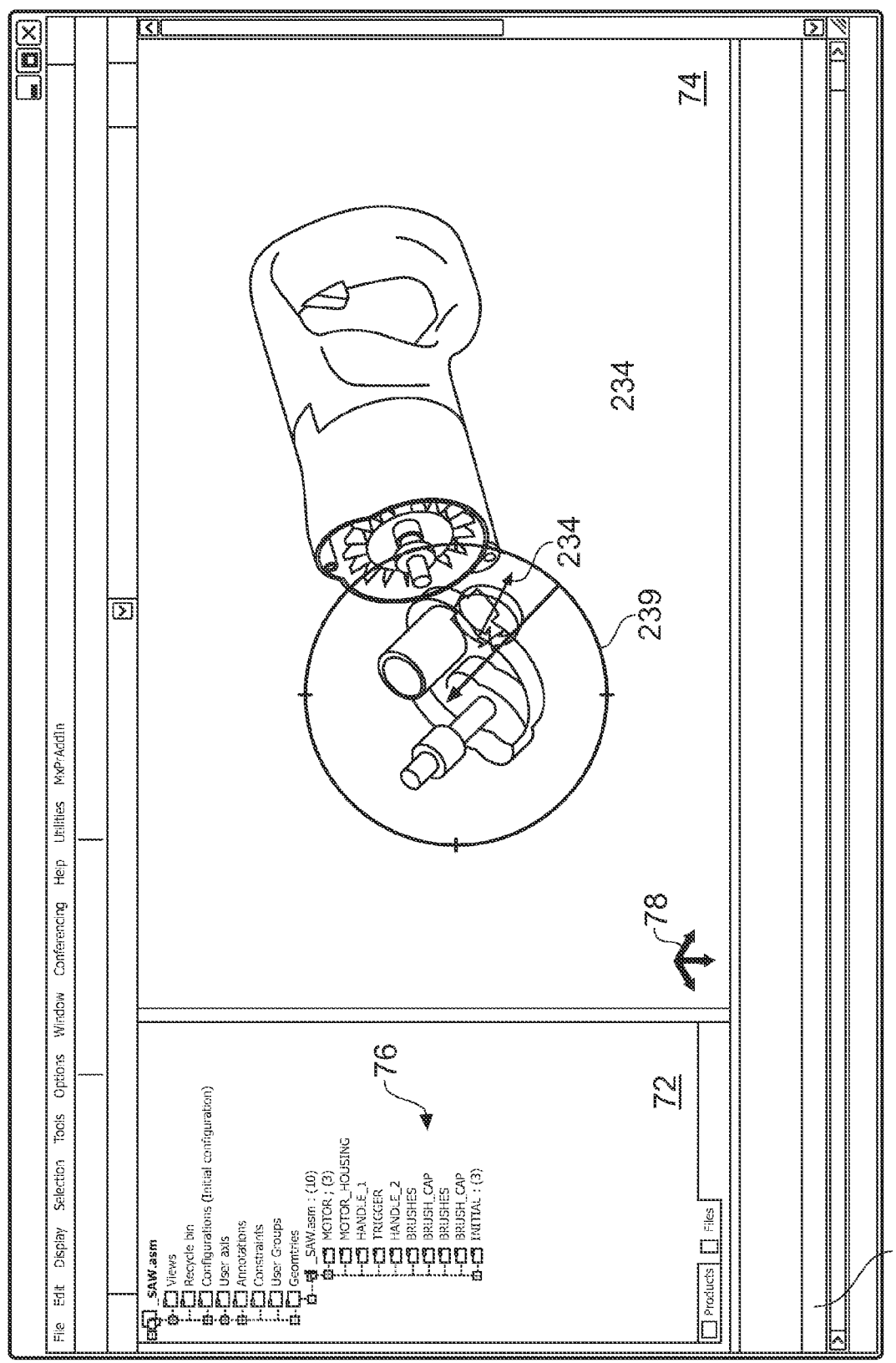

FIG. 11 illustrates the result of a rotation from the position shown in FIG. 10 about the axis 234 shown in FIG. 9. For example, this can be effected by the user selecting the rotation control arrow 238 for the axis 234 by placing a mouse pointer over the control 238 for the axis 234, clicking the mouse button and then dragging the control by a desired amount. In the present instance, a rotation of 45 degrees about that axis has been performed. During rotation, as illustrated in FIG. 9, a reference circle 239 can be displayed to facilitate identification of a degree of rotation (e.g., for a value of 45°, 90°, etc.). The amount of rotation can also be indicated beside the circle, so that the user can control in an accurate way the rotation angle he wants to set.

Figure 12:
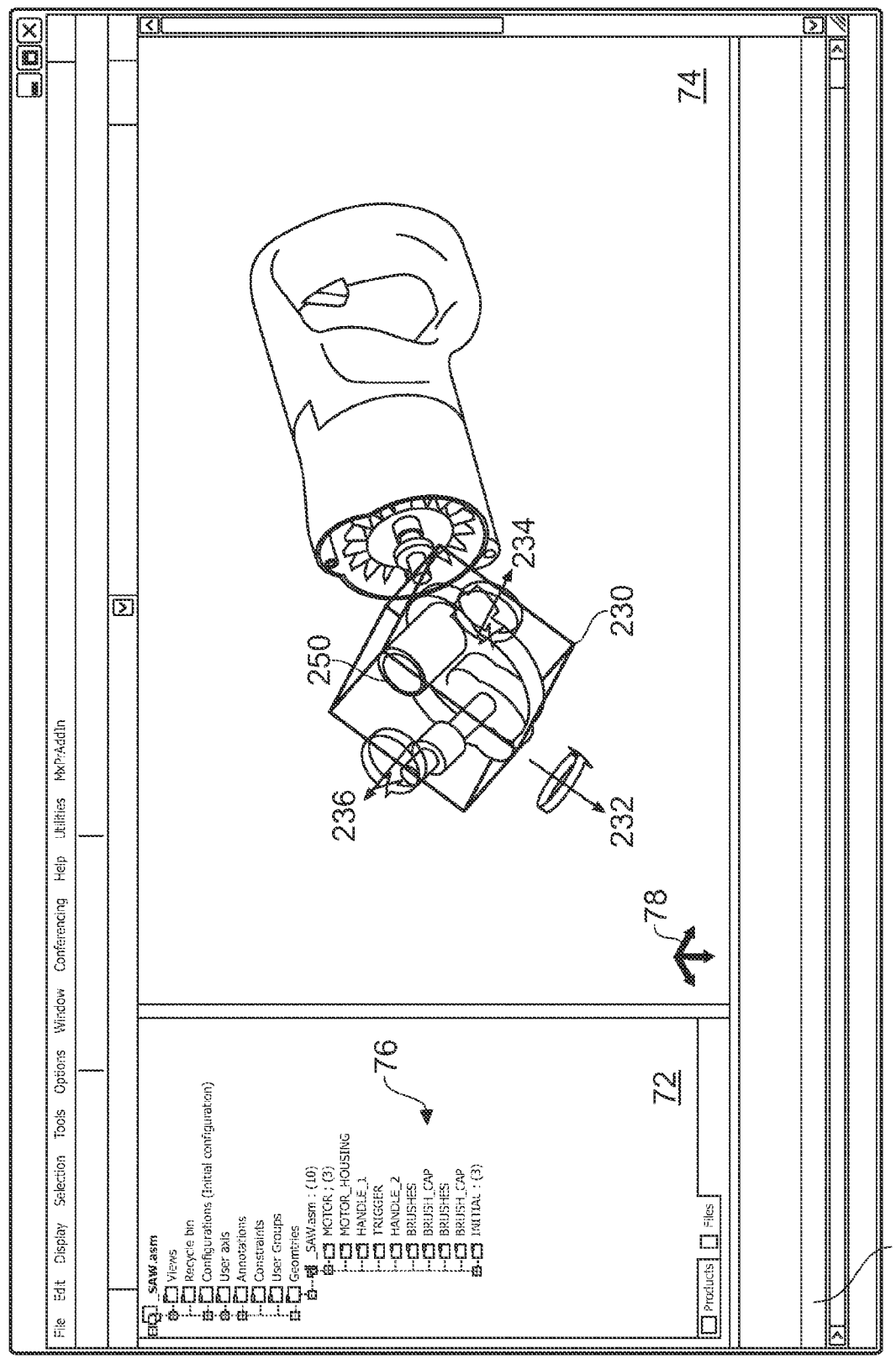

FIG. 12 illustrates the result of the translation and rotation described with reference to FIGS. 10 and 11, whereby it can be seen that the axis 232, 234 and 236 have changed with respect to their initial orientation, along with the change in orientation and position of the bounding box 230 and the component sub-assembly 250.

It can be seen that a translation and a rotation have been effected very efficiently in a couple of steps whereby significantly more steps and more time would be required if manipulation were to be performed on the basis of the global coordinate axes 78 represented in the right hand pane 74.

Figure 13:
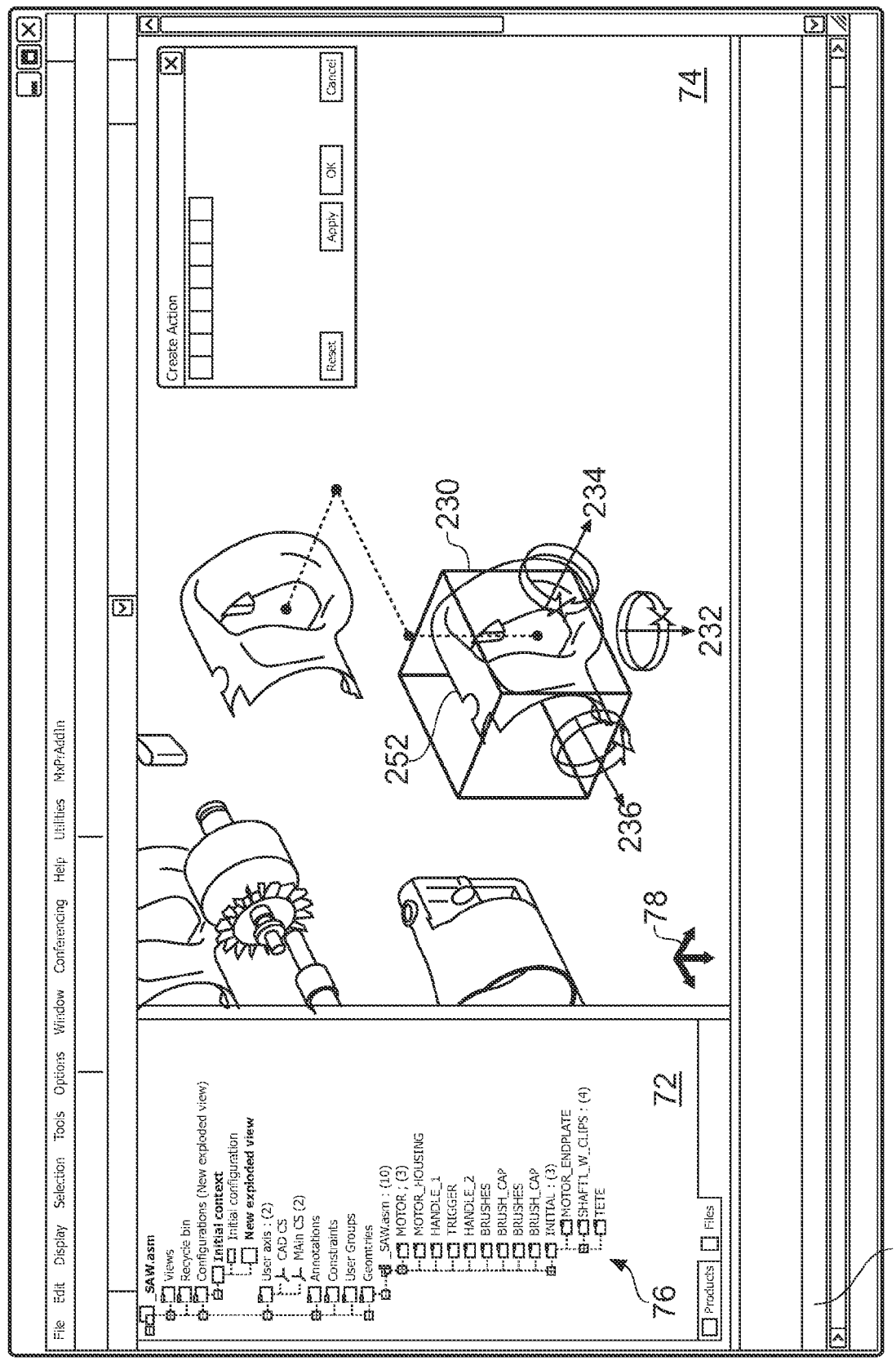

FIG. 13 illustrates a related functionality that is termed "drag and drop action". In this case, where a part is selected, a user can select actions based on where the part is to be dragged and dropped. As illustrated in FIG. 13, a button in a create action dialogue enables a part to be dragged along one of the three part centric axis (i.e., the axes 232, 234 and 236 that relate to the part concerned), whereby each drag represents a portion of the trajectory the part will follow. This approach provides an advantageous method of moving a part along a trajectory that can be defined easily with a few clicks and drag and drop operations.

Accordingly, it can be seen that the drag and drop functionality described with reference to FIGS. 8 to 13 can provide manipulation that is not linked to global movement, but is based on a part (component, sub-assembly or assembly) level.

The display of indicators corresponding to the selected part coordinate axes, that form the controls for effecting the translations and rotations of the selected part, can facilitate the manipulation and the displacement of that selected part of the assembly Control of the displacement of parts can thereby be facilitated, and can be configured readily to show the nature of the displacement and the amount of the displacement. The referenced coordinate system used is part centric. The orientation can follow the part, and reference can be maintained with respect to the part. This contrasts to the conventional approach of moving part parallel to the screen, rotating according to general coordinate systems.

The drag and drop functionality thereby allows rapid movement of entities on a display screen. A displayed bounding box can be displayed which shows the displacement directions oriented according to the coordinates system of the part concerned. At each stage, the orientation of the bounding box and the controls follow the part to which they relate to facilitate sequential displacements.

Drag and drop animations are much easier to create and orchestrate with less steps being necessary to create an exploded animation action based on a drag and drop functionality. A trajectory can be specified by drag and drop operation, with actions defined in respect thereto.

Figure 14:
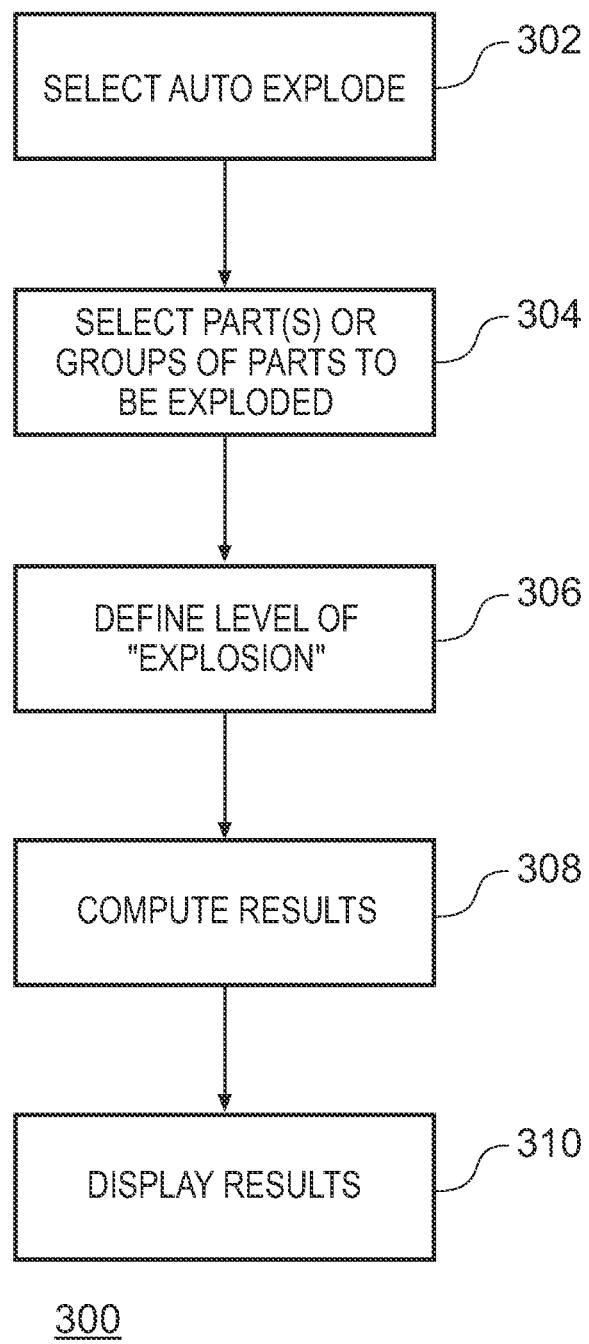
FIG. 14 is a flow diagram illustrating an auto-explode functionality.

FIG. 14 is a flow diagram illustrating an auto-explode process 300. The auto-explode process can provide an exploded view in an automatic way of an assembly, or part of an assembly, based on the hierarchy of parts represented by the parts tree 76 and the left hand pane 72 of the window illustrated in FIG. 6. The exploded view can specify a trajectory of parts using a simple interface. The auto-explode can be provided in separate stages, by level. Accordingly, a first auto-explode can be provided at high level based on high level sub-assemblies, and then in a plurality of iterative stages, the sub-assemblies can be exploded into sub-sub-assemblies, sub-sub-sub-assemblies, and so on.

In step 302, an auto explode function is selected. In step 304, selected parts or groups of parts to be exploded can be selected. In step 306, the level of the explosion can be defined. In step 308, the process is then able to compute the results of the explosion in accordance with the defined parameters. In step 310, the result of the explosion can be represented.

An example of the explosion of parts in a plurality of hierarchical stages will now be described with reference to FIGS. 15-19.

Figure 15:
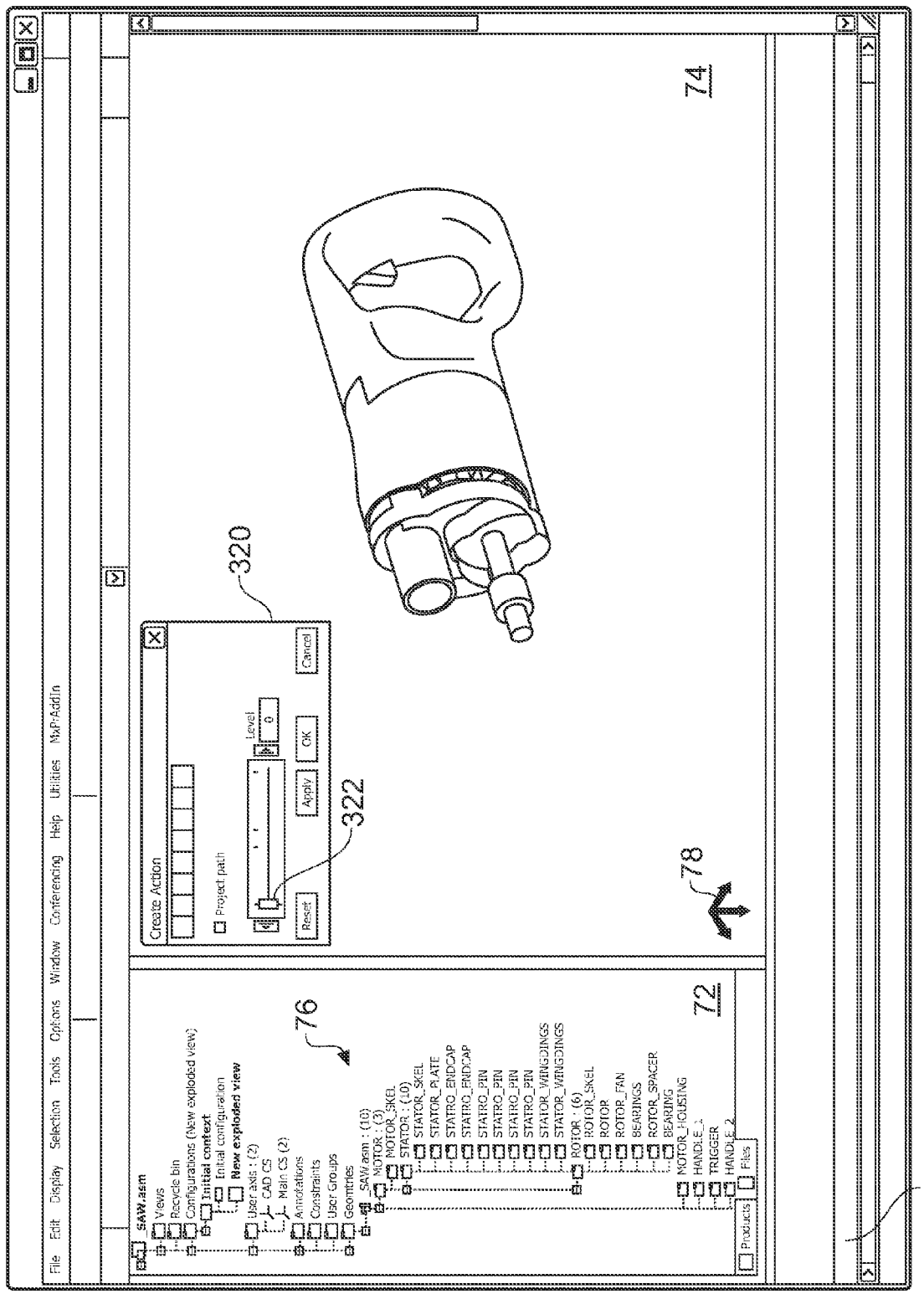
FIGS. 15-18 are screen shots illustrating an example of an auto-explode functionality.
Figure 16:
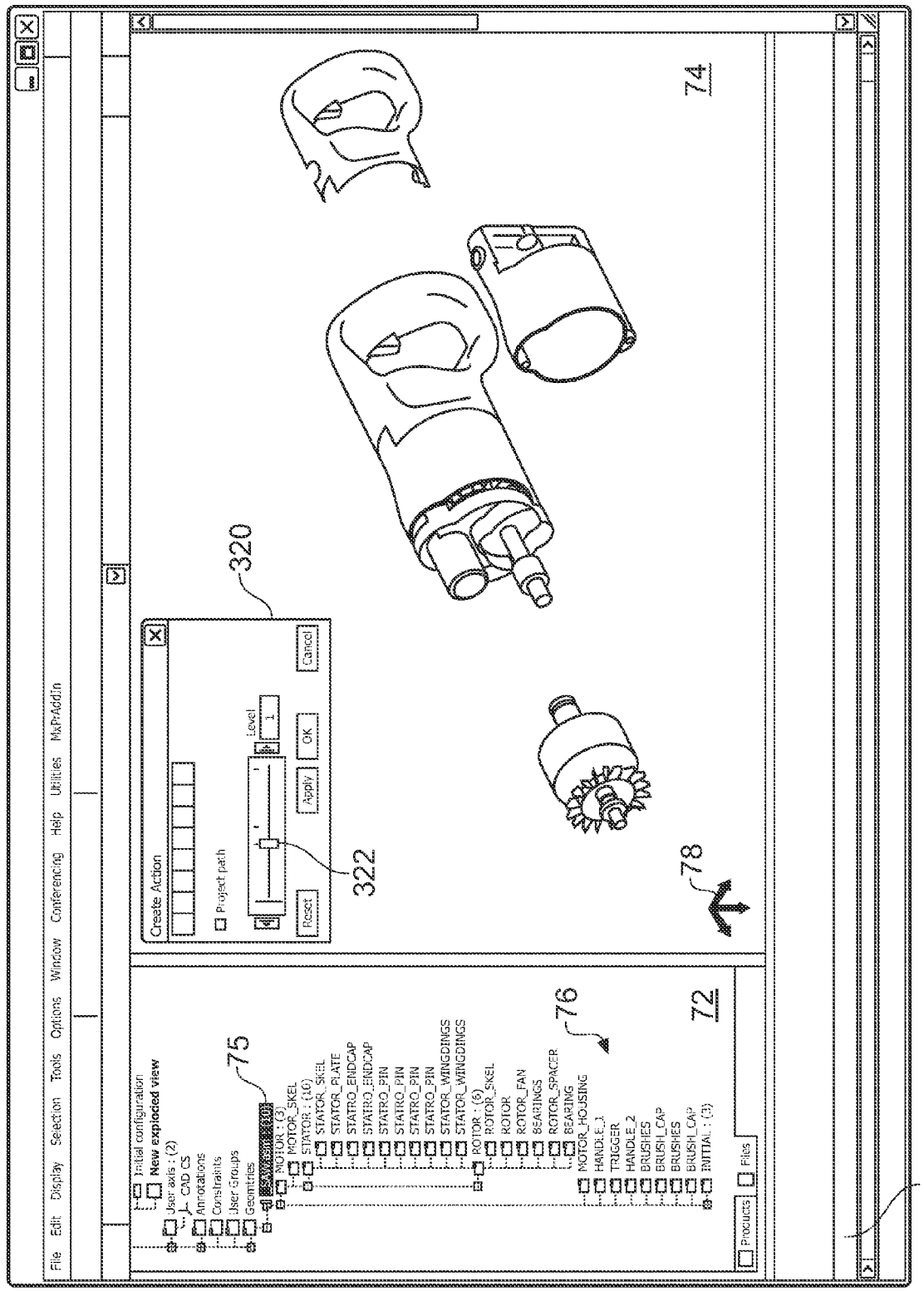

The left hand pane 72 of FIG. 15 shows the file hierarchy for a saw, which has been selected to be exploded. The right hand pane illustrates the selected saw. A "create action" dialogue window 320 includes a slider 322 which is fully to the left, indicating that the position is the original one, that is without any explosion FIG. 16 illustrates that the data element for the saw has been highlighted in the left hand pane 72 at 75, indicating that the whole saw assembly has been selected as the "part" to be exploded. In another example of operation, a sub-assembly of the saw could equally have been selected as the "part" to be exploded. As mentioned above, where reference is made to a part in the following, it is to be understood that the part can be a single component or a sub-assembly or complete assembly of components.

FIG. 16 also illustrates that the "create action" dialogue box 320 has its slider 322 at the first tick mark, indicating that all first level sub-assemblies (sub-elements) of the saw are exploded. Moving the slider 322 between the zero position and the first tick mark causes individual sub-elements to be exploded sequentially, that is as the slider 322 moves the right each sub-assembly is exploded from the main assembly until once the slider 322 is at the first tick mark, all of the first level sub-elements have been exploded, and is represented in FIG. 16. In this example, the motor, housing, handle, trigger, etc., are exploded, but none of the sub-parts of the motor are broken out. In other words, the parts at the first sub-level of the hierarchy shown in the left pane of FIG. 16 are exploded in the right hand pane.

Figure 17:
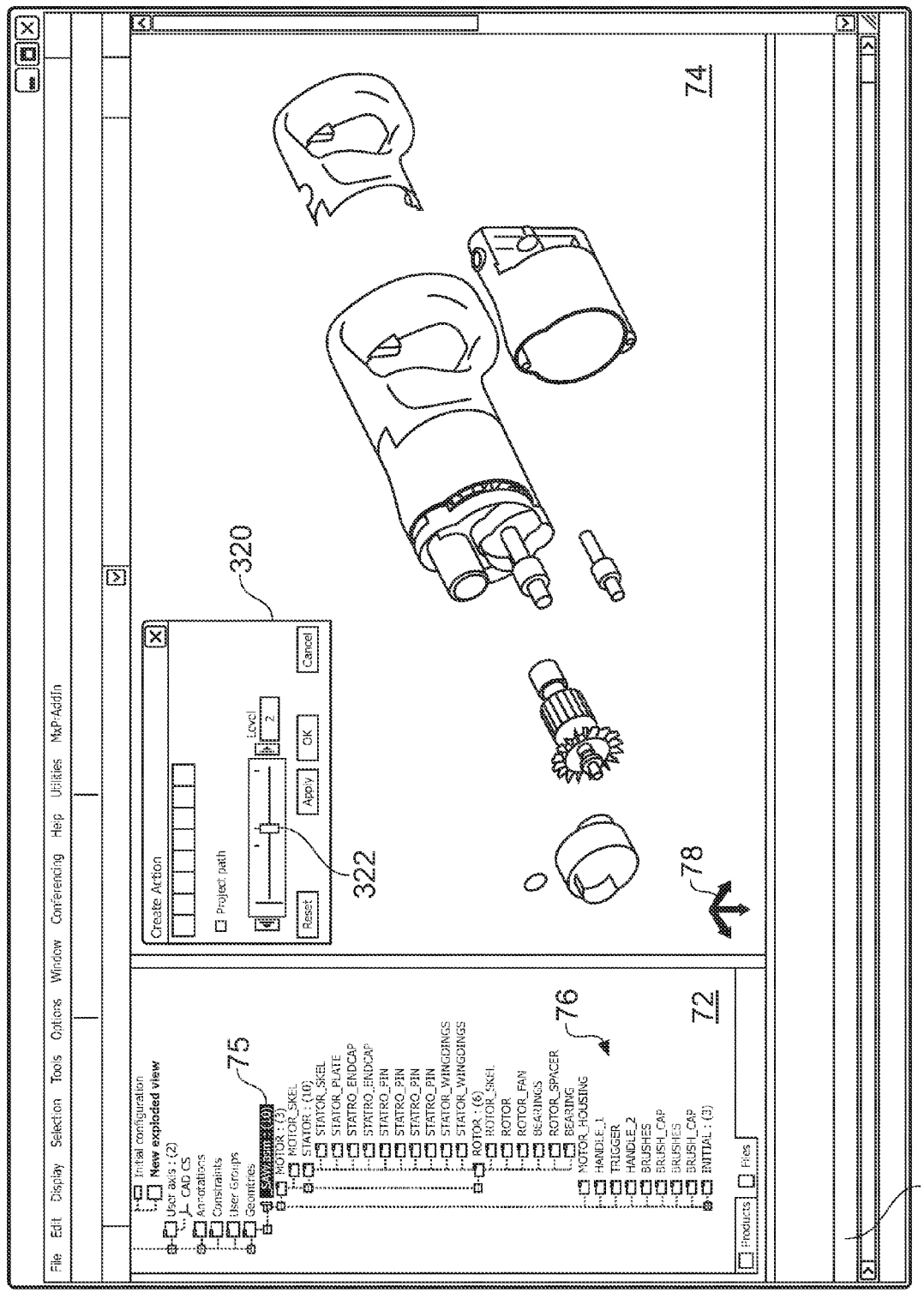

FIG. 17 illustrates a next stage in the hierarchical explosion of the components. In FIG. 17, the slider 322 in the dialogue box 320 is now aligned with the second tick mark. This indicates that the assembly is exploded down to the second level of the hierarchy. Here it can be seen that the motor is broken out to show the motor_skel, the stator and the rotor. In other words, the parts at the first and second sub-levels of the hierarchy shown in the left pane of FIG. 17 are exploded in the right hand pane.

Figure 18:
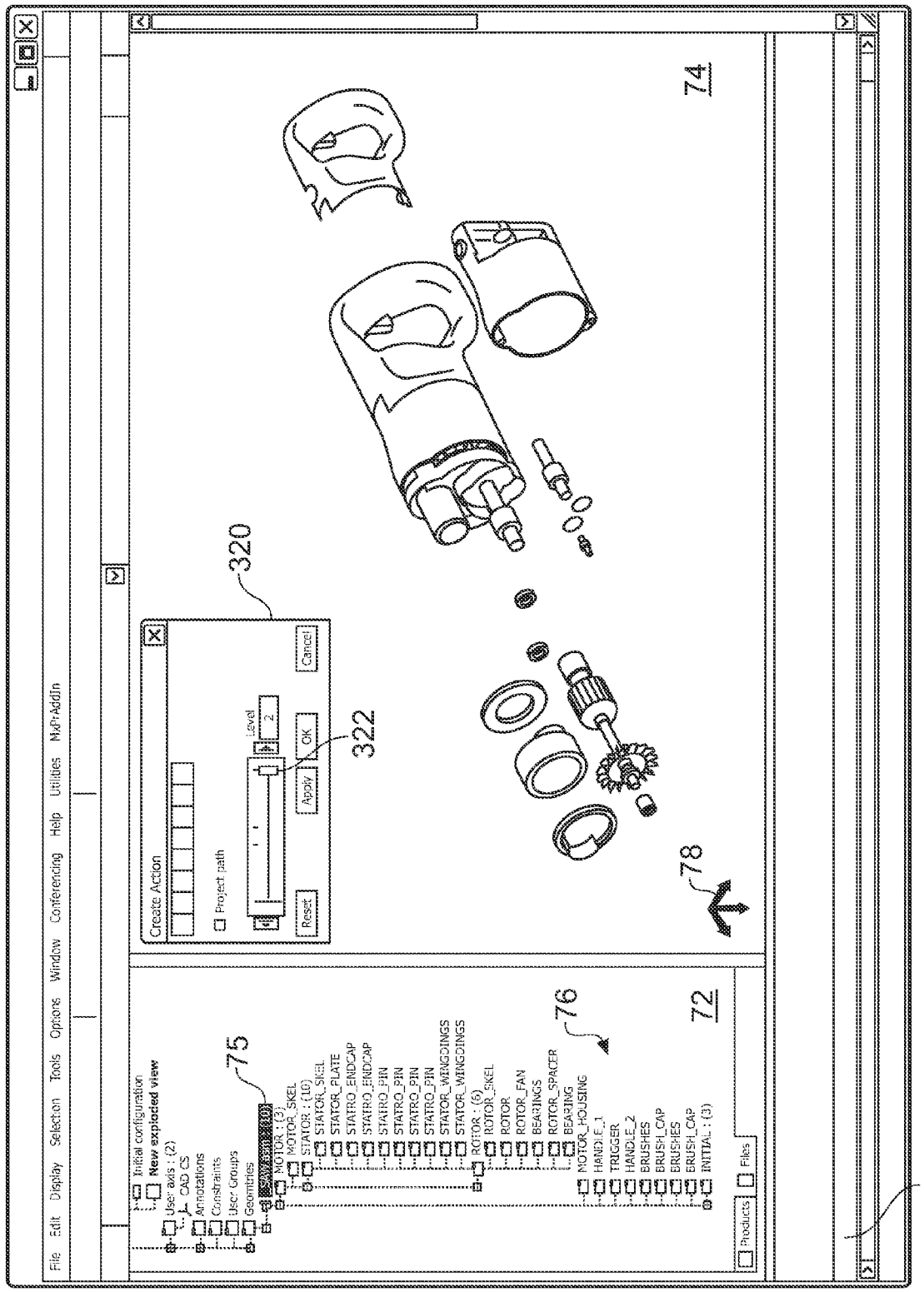

FIG. 18 shows that the slider 322 in the dialogue box 320 is now in the right-most position, that is at the third tick. This indicates that components as far as the third sub-level of the assembly hierarchy in the left pane have been exploded in the right hand pane. In this case, the rotor assembly and the stator assembly are each exploded into their constituent parts.

Figure 19:
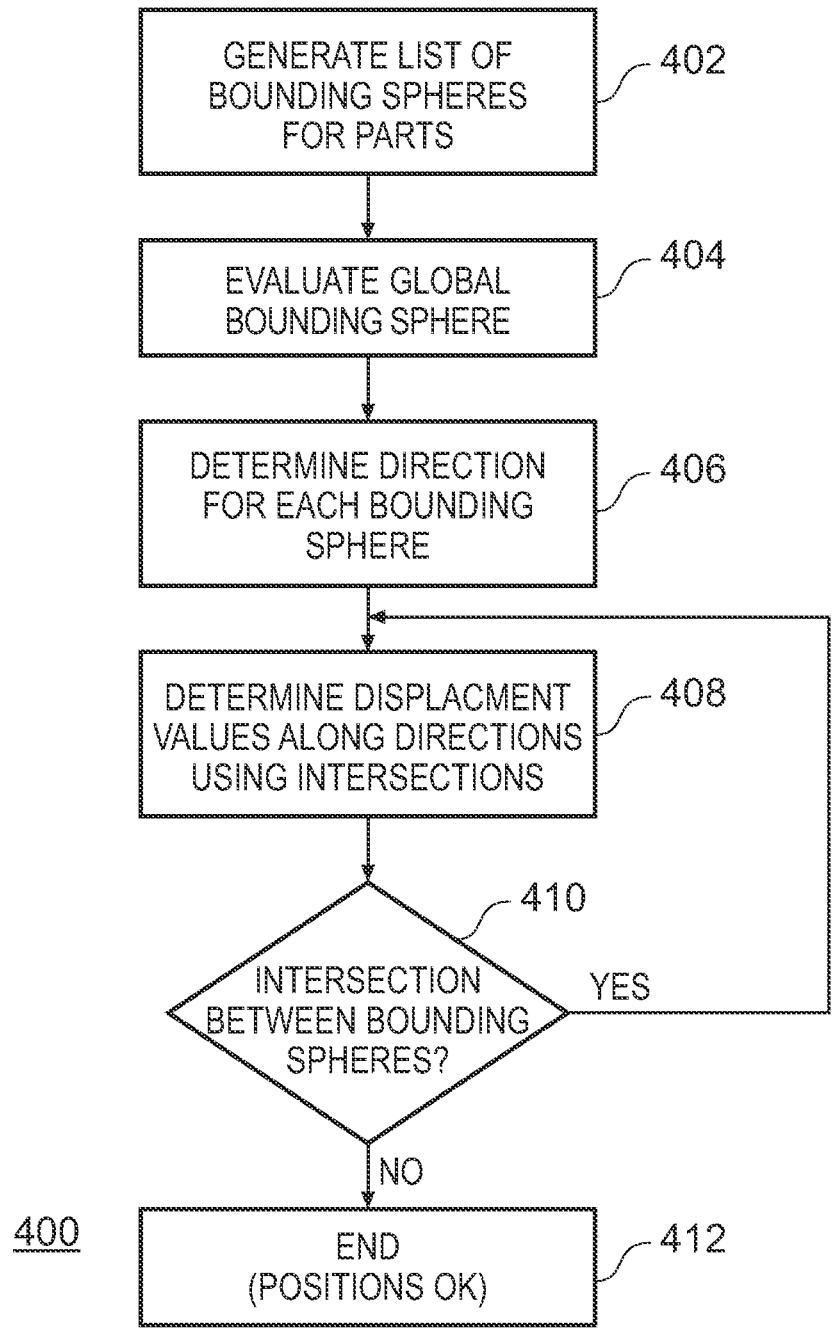
FIGS. 19 and 20 illustrate an example computation of auto explosion results.

FIG. 19 is a flow diagram 400 detailing the compute results step 308 of FIG. 14.

Figure 20:
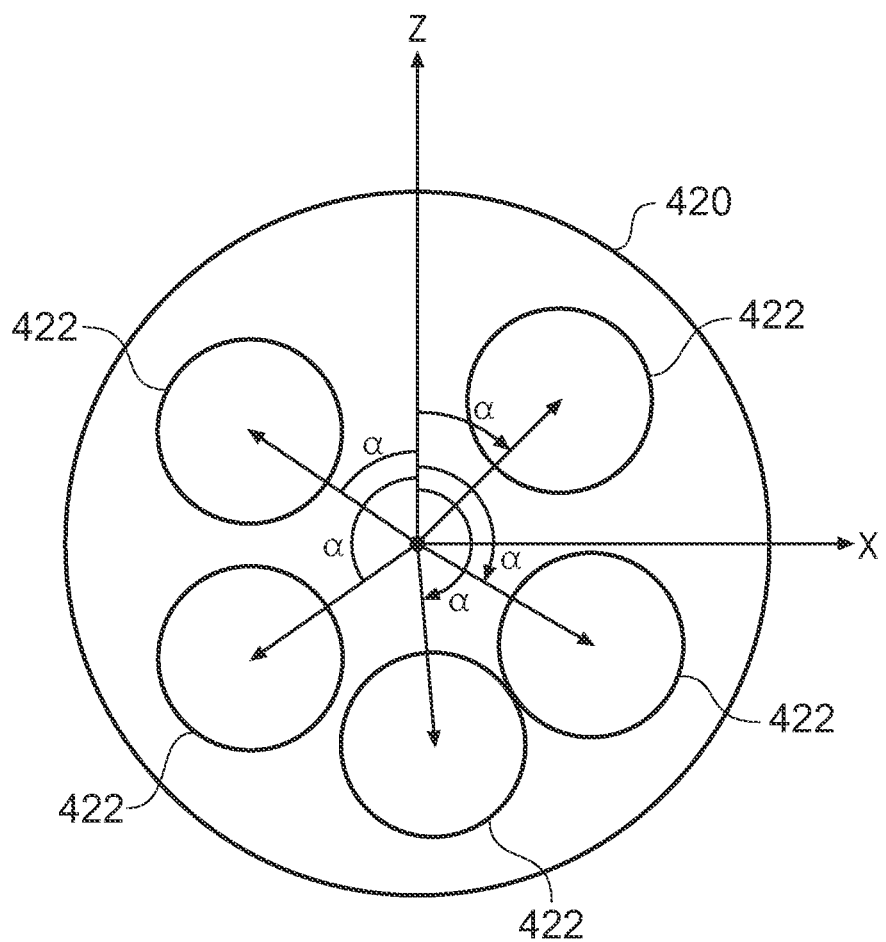

In step 402, in response to the user having selected a degree of explosion at a given level, the system steps through the hierarchy to generate a list of bounding spheres for each part at the selected level. A bounding sphere is the smallest sphere to completely contain a part in question. As before, a part can be a single component or a sub-assembly or assembly of components according to the level in the hierarchy. In the description of FIGS. 19 and 20, reference is made to bounding spheres. However, in another example, bounding boxes could be used rather than bounding spheres.

In step 404, a global bounding sphere is evaluated.

In step 406, the directions of the actions are determined according to all of the bounding spheres for the parts.

In step 408, the displacement values along the previously calculated directions are determined for all parts, according to their bounding sphere sizes and intersections (see also FIG. 20).

In step 410, if intersections between updated bounding spheres are detected (according to the new parts positions), indicative of a potential intersection between the parts, then the algorithm passes back to step 408 to compute a different explosion for these parts (e.g., along different trajectories or by different amounts).

Alternatively, control passes via step 412 to step 310 in FIG. 14 to represent the results of the explosion.

FIG. 20 illustrates an example of the movement of the bounding spheres for the parts with respect to a center of global bounding sphere.

A vector between the center of the global bounding sphere 420 and the bounding sphere 422 for a part gives a first evaluation of a direction for a trajectory for a part associated with the bounding sphere for the part. In this example, the vectors for the respective parts are like branches of a star.

In this example, the spheres for the respective parts are sorted according to the angle $\alpha$ between its vector and a z axis.

Using the sorted list of bounding spheres, the translation along the vector can be computed to avoid an intersection between the bounding sphere for a given part and a previously computed trajectory. In one example, the operation can seek to minimize the translations needed.

It can be seen that the hierarchical explosion of the components using the slider 322 can provide a method for exploding the parts in a user friendly and easily controllable manner. It can provide the ability to work on selected sub-level of the assembly, and to process also the explosion through sequential operations with different selections.

An example process can use both the hierarchical structure of selected data and data positions and sizes in space so that at the end of the explosion process there is no interference between the involved parts.

In one example, a trajectory of parts for an exploded view can be defined according to a user preference. For example drag and drop functionality as described above could be used.

Accordingly, there has been defined an apparatus and method for the display and manipulation of CAD.

An automatic exploded view can be provided selecting a level of explosion based on the hierarchical structure of an assembly. The different hierarchical levels can be selected to provide a logical sequence of explosion with the gradual explosion of the parts from a high level to a low level. The auto-explode process for generating an exploded view of an object represented by a hierarchy of data elements can provide degrees of explosion in an iterative manner based on the hierarchy of data elements.

The explosion can be of an assembly, or part of an assembly, and can be based on a hierarchy of parts represented by a parts tree. A first auto-explode can be provided at high level based on high level sub-assemblies, and then in a plurality of iterative stages, the sub-assemblies can be exploded into sub-subassemblies, sub-sub-sub-assemblies, and so on.

An embodiment of the invention can provide a computer program product comprising program code for carrying out a method referenced above. A computer system can be programmed by the program code of the computer program product for carrying out a method referenced above.

An embodiment of the invention can provide a computer system comprising at least one processor, memory and storage, the computer being operable to load at least one selected data element from the storage into the memory to generate a context comprising part of the data structure; and separately to store a record of the context for later retrieval.

There has been described a method, apparatus and computer program for effective context management and the manipulation and presentation of computer aided design data. Although in the examples described above, a display is used for presenting information to the user, other output devices can be used for presenting information to a user.

A computer program product for implementing the invention can be in the form of a computer program on a carrier medium. The carrier medium could be a storage medium, such as a solid state, magnetic, optical, magneto-optical or other storage medium. The carrier medium could be a transmission medium such as broadcast, telephonic, computer network, wired, wireless, electrical, electromagnetic, optical or indeed any other transmission medium.

Although the embodiments above have been described in considerable detail, numerous variations and modifications will become apparent to those skilled in the art once the above disclosure is fully appreciated. It is intended that the following claims be interpreted to embrace all such variations and modifications as well as their equivalents.

What is claimed is:

1. A method, comprising:
performing, by a computer:
   obtaining a data structure representing an object, wherein the object is an assembly of a plurality of parts, wherein the data structure comprises a plurality of hierarchically arranged data elements each representing one of the plurality of parts of the assembly, wherein each of the plurality of parts of the assembly is either a single distinct component of the assembly or a sub-assembly of two or more others of the plurality of parts of the assembly;
   receiving input selecting one of the parts of the assembly for which an exploded view is to be generated, wherein the selected part is a sub-assembly of two or more others of the plurality of parts; and
   automatically generating an exploded view of the selected sub-assembly, wherein said automatically generating an exploded view of the selected sub-assembly comprises:
      determining a global bounding region for the sub-assembly;
      determining a bounding region for each of the parts of the sub-assembly;
      for each of the parts of the sub-assembly, dynamically determining a vector for the respective part according to a center of the global bounding region for the sub-assembly and a center of the bounding region for the respective part;
      dynamically determining a displacement for each of the parts in the direction of its respective vector such that the bounding regions for the parts of the sub-assembly do not intersect; and
      displaying each of the parts of the sub-assembly at a location indicated by the direction of its respective vector and its respective displacement.

2. The method of claim 1, wherein at least one part of the selected sub-assembly is another sub-assembly of two or more others of the plurality of parts, wherein said automatically generating an exploded view of the selected sub-assembly comprises automatically generating an exploded view of the at least one other sub-assembly.

3. The method of claim 1, wherein the bounding region is a bounding sphere or a bounding box.

4. The method of claim 1, further comprising receiving input specifying a vector indicating a direction of displacement for at least one of the parts of the selected sub-assembly.

5. The method of claim 1, further comprising:
receiving input selecting one of the displayed parts of the sub-assembly, wherein the selected part is another sub-assembly of two or more others of the plurality of parts; and
automatically generating an exploded view of the selected displayed part of the sub-assembly.

6. The method of claim 1, further comprising:
displaying an interface element indicating two or more selectable different levels of explosion, wherein each level of explosion corresponds to a different level at which parts of the selected sub-assembly are to be exploded; and
receiving input selecting one of the levels of explosion;
wherein, in said automatically generating an exploded view of the selected sub-assembly, the exploded view is generated according to the selected level of explosion.

7. The method of claim 6, wherein the interface element indicates a first level of explosion at which the selected sub-assembly is exploded into its two or more parts and one or more additional levels of explosion, wherein, at each successive additional level of explosion, an exploded view of one or more parts at the previous level are automatically generated.

8. The method of claim 1, further comprising displaying a representation of two or more of the plurality of parts of the assembly, wherein at least one of the displayed two or more parts is a sub-assembly of two or more others of the plurality of parts of the assembly, wherein said input selecting one of the parts of the assembly for which an exploded view is to be generated selects one of the displayed representations of the two or more of the plurality of parts of the assembly.

9. The method claim 1, wherein the data elements are computer aided design (CAD) data elements representative of parts of the object.

10. The method of claim 1, wherein the data structure is generated from a data set that was generated by a computer aided design (CAD) system.

11. The method of claim 10, wherein the data structure has a format different from that of the data set generated by the CAD system.

12. A computer system, comprising:
   at least one processor;
   storage for a data structure representing an object, wherein the object is an assembly of a plurality of parts, wherein the data structure comprises a plurality of hierarchically arranged data elements each representing one of the plurality of parts of the assembly, wherein each of the plurality of parts of the assembly is either a single distinct component of the assembly or a sub-assembly of two or more others of the plurality of parts of the assembly;
   a display; and
   a memory comprising program code executable by the at least one processor to:
      receive input selecting one of the parts of the assembly for which an exploded view is to be generated, wherein the selected part is a sub-assembly of two or more others of the plurality of parts; and
      automatically generate an exploded view of the selected sub-assembly, wherein, to automatically generate an exploded view of the selected sub-assembly, the program code is executable by the at least one processor to:
         determine a global bounding region for the sub-assembly;
         determine a bounding region for each of the parts of the sub-assembly;
         for each of the parts of the sub-assembly, dynamically determine a vector for the respective part according to a center of the global bounding region for the sub-assembly and a center of the bounding region for the respective part;
         dynamically determine a displacement for each of the parts in the direction of its respective vector such that the bounding regions for the parts of the sub-assembly do not intersect; and
         display, on the display, each of the parts of the sub-assembly at a location indicated by the direction of its respective vector and its respective displacement.

13. The computer system of claim 12, wherein at least one part of the selected sub-assembly is another sub-assembly of two or more others of the plurality of parts, wherein, to automatically generate an exploded view of the selected sub-assembly, the program code is executable by the at least one processor to automatically generate an exploded view of the at least one other sub-assembly.

14. The computer system of claim 12, wherein the bounding region is a bounding sphere or a bounding box.

15. The computer system of claim 12, wherein the program code is executable by the at least one processor to receive input specifying a vector indicating a direction of displacement for at least one of the parts of the selected sub-assembly.

16. The computer system of claim 12, wherein the program code is executable by the at least one processor to:
   receive input selecting one of the displayed parts of the sub-assembly, wherein the selected part is another sub-assembly of two or more others of the plurality of parts; and
   automatically generate an exploded view of the selected displayed part of the sub-assembly.

17. The computer system of claim 12, wherein the program code is executable by the at least one processor to:
   display an interface element indicating two or more selectable different levels of explosion, wherein each level of explosion corresponds to a different level at which parts of the selected sub-assembly are to be exploded; and
   receive input selecting one of the levels of explosion;
   wherein, to automatically generate an exploded view of the selected sub-assembly, the program code is executable by the at least one processor to generate the exploded view according to the selected level of explosion.

18. The computer system of claim 12, wherein the interface element indicates a first level of explosion at which the selected sub-assembly is exploded into its two or more parts and one or more additional levels of explosion, wherein, at each successive additional level of explosion, an exploded view of one or more parts at the previous level are automatically generated.

19. The computer system of claim 12, wherein the program code is executable by the at least one processor to display a representation of two or more of the plurality of parts of the assembly, wherein at least one of the displayed two or more parts is a sub-assembly of two or more others of the plurality of parts of the assembly, wherein said input selecting one of the parts of the assembly for which an exploded view is to be generated selects one of the displayed representations of the two or more of the plurality of parts of the assembly.

20. The computer system of claim 12, wherein the data elements are computer aided design (CAD) data elements representative of parts of the object.

21. The computer system of claim 12, wherein the data structure is generated from a data set that was generated by a computer aided design (CAD) system.

22. The computer system of claim 21, wherein the data structure has a format different from that of the data set generated by the CAD system.

23. A non-transitory computer readable medium storing program code, wherein the program code is computer-executable to:
   access a data structure representing an object, wherein the object is an assembly of a plurality of parts, wherein the data structure comprises a plurality of hierarchically arranged data elements each representing one of the plurality of parts of the assembly, wherein each of the plurality of parts of the assembly is either a single distinct component of the assembly or a sub-assembly of two or more others of the plurality of parts of the assembly;
   receive input selecting one of the parts of the assembly for which an exploded view is to be generated, wherein the selected part is a sub-assembly of two or more others of the plurality of parts; and
   automatically generate an exploded view of the selected sub-assembly, wherein, to automatically generate an exploded view of the selected sub-assembly, the program code is computer-executable to:
      determine a global bounding region for the sub-assembly;
      determine a bounding region for each of the parts of the sub-assembly;
      for each of the parts of the sub-assembly, dynamically determine a vector for the respective part according to a center of the global bounding region for the sub-assembly and a center of the bounding region for the respective part;
      dynamically determine a displacement for each of the parts in the direction of its respective vector such that the bounding regions for the parts of the sub-assembly do not intersect; and
      display each of the parts of the sub-assembly at a location indicated by the direction of its respective vector and its respective displacement.

24. An apparatus comprising:
means for obtaining a data structure representing an object, wherein the object is an assembly of a plurality of parts, wherein the data structure comprises a plurality of hierarchically arranged data elements each representing one of the plurality of parts of the assembly, wherein each of the plurality of parts of the assembly is either a single distinct component of the assembly or a sub-assembly of two or more others of the plurality of parts of the assembly;
means for automatically generating an exploded view of a selected part of the assembly, wherein the selected part is a sub-assembly, and wherein said means for automatically generating an exploded view of the selected sub-assembly comprises:
  means for determining a global bounding region for the sub-assembly;
  means for determining a bounding region for each of the parts of the sub-assembly;
  means for dynamically determining a vector for each of the parts of the selected sub-assembly according to a center of the global bounding region for the sub-assembly and a center of the bounding region for the respective part;
  means for dynamically determining a displacement for each of the parts in the direction of its respective vector such that the bounding regions for the parts of the sub-assembly do not intersect; and
  means for displaying each of the parts of the sub-assembly at a location indicated by the direction of its respective vector and its respective displacement.

* * * * *